(12) United States Patent
Wang et al.

(10) Patent No.: US 12,374,897 B2
(45) Date of Patent: Jul. 29, 2025

(54) MEDIUM-VOLTAGE PHOTOVOLTAIC GRID-CONNECTED INVERTER SYSTEM AND PHOTOVOLTAIC POWER GENERATION SYSTEM

(71) Applicant: SUNGROW POWER SUPPLY CO., LTD., Anhui (CN)

(72) Inventors: Hang Wang, Hefei (CN); Li Ren, Hefei (CN); Peng Sun, Hefei (CN)

(73) Assignee: SUNGROW POWER SUPPLY CO., LTD., Anhui (CN)

( * ) Notice: Subject to any disclaimer, the term of this patent is extended or adjusted under 35 U.S.C. 154(b) by 22 days.

(21) Appl. No.: 17/913,862

(22) PCT Filed: Mar. 16, 2021

(86) PCT No.: PCT/CN2021/080993
§ 371 (c)(1),
(2) Date: Sep. 23, 2022

(87) PCT Pub. No.: WO2021/197045
PCT Pub. Date: Oct. 7, 2021

(65) Prior Publication Data
US 2023/0113216 A1   Apr. 13, 2023

(30) Foreign Application Priority Data

Mar. 30, 2020   (CN) .......................... 202020440999.2

(51) Int. Cl.
*H02J 3/38*   (2006.01)
*G01R 19/00*   (2006.01)
(Continued)

(52) U.S. Cl.
CPC .......... *H02J 3/381* (2013.01); *G01R 19/0084* (2013.01); *H02J 3/40* (2013.01);
(Continued)

(58) Field of Classification Search
CPC .... H02J 3/381; H02J 3/40; H02J 9/068; H02J 2300/24; G01R 19/0084; H02M 7/537; Y02E 10/56
(Continued)

(56) References Cited

U.S. PATENT DOCUMENTS 10,211,625 B2 *   2/2019   Sivakumar .............. H02J 3/381
11,159,011 B2 *   10/2021   Schelenz ................... H02J 3/42
(Continued)

FOREIGN PATENT DOCUMENTS

CN   203415994 U   1/2014
CN   103730911 A   4/2014
(Continued)

OTHER PUBLICATIONS

International Search Report (English and Chinese) and Written Opinion of the International Searching Authority (Chinese) issued in PCT/CN2021/080993, mailed Jun. 18, 2021; ISA/CN.
Extended European Search Report regarding Application No. 21780019.2, dated Apr. 11, 2024.

*Primary Examiner* — Richard Tan
(74) *Attorney, Agent, or Firm* — Harness, Dickey & Pierce, P.L.C.

(57) ABSTRACT

A medium voltage grid-connected photovoltaic inverter system and a photovoltaic power generation system including the same are provided. The medium voltage grid-connected photovoltaic inverter system includes a photovoltaic inverter, a medium voltage transformer, a switchgear, and an inverter grid-connected controller. A low voltage side of the medium voltage transformer is connected to an alternating current output terminal of the photovoltaic inverter. An input terminal of the switchgear is connected to a high voltage side of the medium voltage transformer, and each phase of the switchgear includes two output terminals each for being connected to another switchgear. The inverter grid-con-
(Continued)

nected controller is connected to a controlled terminal of the switchgear, and is configured to control the switchgear to switch off/on, so that the medium voltage grid-connected photovoltaic inverter system is disconnected from or connected to a grid.

8 Claims, 1 Drawing Sheet

(51) Int. Cl.
*H02J 3/40* (2006.01)
*H02J 9/06* (2006.01)
*H02M 7/537* (2006.01)

(52) U.S. Cl.
CPC .............. *H02J 9/068* (2020.01); *H02M 7/537* (2013.01); *H02J 2300/24* (2020.01)

(58) Field of Classification Search
USPC .......................................................... 307/82
See application file for complete search history.

(56) References Cited

U.S. PATENT DOCUMENTS

| | | | |
|---|---|---|---|
| 2012/0039101 A1* | 2/2012 | Falk | H02J 3/42 363/95 |
| 2015/0069841 A1 | 3/2015 | Falk et al. | |
| 2015/0189705 A1* | 7/2015 | Ghosh | H02J 3/466 315/161 |
| 2019/0157982 A1* | 5/2019 | Brueckner | H02M 7/125 |

FOREIGN PATENT DOCUMENTS

| | | | |
|---|---|---|---|
| CN | 104319809 A | | 1/2015 |
| CN | 205753589 U | | 11/2016 |
| CN | 107947236 A | | 4/2018 |
| CN | 108695899 A | | 10/2018 |
| CN | 110829482 | * | 2/2020 |
| CN | 211908388 U | | 11/2020 |
| CN | 112398175 A | | 2/2021 |
| CN | 112436557 A | | 3/2021 |

* cited by examiner

MEDIUM-VOLTAGE PHOTOVOLTAIC GRID-CONNECTED INVERTER SYSTEM AND PHOTOVOLTAIC POWER GENERATION SYSTEM

The present application is the national phase of International Patent Application No. PCT/CN2021/080993, titled "MEDIUM-VOLTAGE PHOTOVOLTAIC GRID-CONNECTED INVERTER SYSTEM AND PHOTOVOLTAIC POWER GENERATION SYSTEM", filed on Mar. 16, 2021, which claims the priority to Chinese patent application No. 202020440999.2, titled "MEDIUM-VOLTAGE PHOTOVOLTAIC GRID-CONNECTED INVERTER SYSTEM AND PHOTOVOLTAIC POWER GENERATION SYSTEM", filed on Mar. 30, 2020 with the China National Intellectual Property Administration, both of which are incorporated herein by reference in their entireties.

FIELD

The present disclosure relates to the technical field of photovoltaic power generation, and in particular to a medium voltage grid-connected photovoltaic inverter system and a photovoltaic power generation system.

BACKGROUND

Generally, in a grid-connected photovoltaic power system of a large photovoltaic power station, a photovoltaic inverter is connected to a low voltage power grid via a low voltage contactor or circuit breaker, and then connected a medium voltage power grid via a step-up transformer. In a power station requiring high reliability of grid-connected photovoltaic system, a ring main unit may be connected between the step-up transformer and the power grid, to connect multiple photovoltaic inverter units to obtain a ring-type network.

For example, in the existing technical solution recited in a document titled "medium voltage grid-connected photovoltaic system, control method therefore and square array unit", multiple inverters are connected in parallel and connected to a low voltage side of a medium voltage transformer, and then form a square array unit of a medium voltage grid-connected photovoltaic inverter system together with a medium voltage circuit breaker, an electric operating mechanism, a medium voltage state monitoring module, a control module, a cable switch and the like. Multiple square array units are connected via cable switches, to form a "hand-in-hand" ring-type network system. In this technical solution, in order to reduce the impact of an inrush current due to excitation of the transformer on the power grid at the time instant of power-on after a short-term power outage of the power grid, multiple inverters are connected in parallel to one medium voltage transformer to form a square array unit, thereby reducing the number of transformers in the photovoltaic system. In addition, multiple square array units are connected via CCV ring main units to form a ring-type network. When the medium voltage state monitoring module monitors a power outage of the power grid, the control module sends an instruction to switch off the medium voltage circuit breaker. When the power grid is powered on, the control module controls the medium voltage circuit breaker to switch on immediately after a preset delay, so that multiple square array units are connected to the power grid sequentially, thereby reducing the impact of the inrush current due to excitation of the transformer on the power grid.

Although the photovoltaic inverter system is connected to a medium voltage grid to a certain extent according to the above technical solution, the ring-type network is supplied with power via the ring main unit, resulting in large size, difficulty in installation, and high cost.

SUMMARY

A medium voltage grid-connected photovoltaic inverter system and a photovoltaic power generation system are provided according to the present disclosure, so that a photovoltaic inverter is connected to a medium voltage grid without a ring main unit.

In order to connect a photovoltaic inverter to a medium voltage grid without a ring main unit, a medium voltage grid-connected photovoltaic inverter system is provided according to the present disclosure. The medium voltage grid-connected photovoltaic inverter system is applied in a photovoltaic power generation system. The medium voltage grid-connected photovoltaic inverter system in the photovoltaic power generation system is more than one in number. The medium voltage grid-connected photovoltaic inverter system includes a photovoltaic inverter, a medium voltage transformer, a switchgear, and an inverter grid-connected controller.

A direct current input terminal of the photovoltaic inverter is connected to a direct current bus.

A low voltage side of the medium voltage transformer is connected to an alternating current output terminal of the photovoltaic inverter.

An input terminal of the switchgear is connected to a high voltage side of the medium voltage transformer, and each phase of the switchgear includes two output terminals each configured to be connected to a switchgear of another medium voltage photovoltaic grid-connected system.

The inverter grid-connected controller is connected to a controlled terminal of the switchgear, and is configured to control the switchgear to switch off to disconnect the medium voltage grid-connected photovoltaic inverter system from a grid, or control the switchgear to switch on to connect the medium voltage grid-connected photovoltaic inverter system to a grid.

Optionally, the medium voltage grid-connected photovoltaic inverter system further includes a direct current bus voltage detection circuit.

A detection terminal of the direct current bus voltage detection circuit is connected to the direct current bus, an output terminal of the direct current bus voltage detection circuit is connected to the inverter grid-connected controller. The direct current bus voltage detection circuit is configured to detect a voltage of the direct current bus, and generate a direct current bus voltage detection signal.

The inverter grid-connected controller is further configured to control the switchgear to switch off when it is determined based on the direct current bus voltage detection signal that the voltage of the direct current bus is less than a first preset voltage threshold.

Optionally, the inverter grid-connected controller is further configured to control the switchgear to switch off when it is determined based on the direct current bus voltage detection signal that the voltage of the direct current bus is less than the first preset voltage threshold for a first preset period of time.

Optionally, the medium voltage grid-connected photovoltaic inverter system further includes a grid-connected voltage detection circuit.

A first detection terminal of the grid-connected voltage detection circuit is connected to the high voltage side of the medium voltage transformer, a second detection terminal of the grid-connected voltage detection circuit is connected to a side of a medium voltage power grid. The grid-connected voltage detection circuit is configured to detect a line voltage at the high voltage side of the medium voltage transformer and a line voltage at the side of the medium voltage power grid, and generate a grid-connected voltage detection signal.

The inverter grid-connected controller is further configured to control the switchgear to switch on when it is determined based on the grid-connected voltage detection signal that the line voltage currently detected at the high voltage side of the medium voltage transformer and the line voltage current detected at the side of the medium voltage power grid satisfy a grid-connected condition.

Optionally, the grid-connected condition is that the line voltage at the high voltage side of the medium voltage transformer and the line voltage at the side of the medium voltage power grid have the same phase, same phase sequence and same amplitude.

Optionally, the medium voltage grid-connected photovoltaic inverter system further includes an ambient light sensor. An output terminal of the ambient light sensor is connected to the inverter grid-connected controller, and the ambient light sensor is configured to detect ambient light, and output an ambient light detection signal.

The inverter grid-connected controller is further configured to control the switchgear to switch off when it is determined based on the ambient light detection signal that the ambient light currently detected is less than a preset threshold.

Optionally, the inverter grid-connected controller is further configured to control, in response to reception of a reactive power transmission signal, the switchgear to switch on.

Optionally, the looped network switch is a ring medium voltage circuit breaker, a medium voltage load switch or a medium voltage contactor.

A photovoltaic power generation system is further provided according to the present disclosure. The photovoltaic power generation system includes a medium voltage power system and multiple above-mentioned medium voltage grid-connected photovoltaic inverter systems.

Optionally, each of the multiple medium voltage photovoltaic grid-connected systems includes a photovoltaic inverter, a medium voltage transformer, a switchgear and an inverter grid-connected controller. A direct current input terminal of the photovoltaic inverter is connected to a direct current bus.

A low voltage side of the medium voltage transformer is connected to an alternating current output terminal of the photovoltaic inverter.

An input terminal of the switchgear is connected to a high voltage side of the medium voltage transformer, and each phase of the switchgear includes two output terminals each connected to a switchgear of another medium voltage photovoltaic grid-connected system among the multiple medium voltage photovoltaic grid-connected systems.

The inverter grid-connected controller is connected to a controlled terminal of the switchgear, and is configured to control the switchgear to switch off to disconnect the medium voltage grid-connected photovoltaic inverter system from a grid, or control the switchgear to switch on to connect the medium voltage grid-connected photovoltaic inverter system to a grid.

The multiple medium voltage grid-connected photovoltaic inverter systems are connected to each other via output terminals of respective switchgears.

According to the present disclosure, the alternating current output side of the photovoltaic inverter is connected to the low voltage side of the medium voltage transformer, the high voltage side of the medium voltage transformer is connected to the switchgear, and the output end of the switchgear is connected to the medium voltage power grid, thereby forming a medium voltage grid-connected photovoltaic inverter system based on the switchgear. Therefore, the medium voltage grid-connected photovoltaic inverter system can be directly connected to the grid to form a ring network, and the number of the ring main unit is reduced.

BRIEF DESCRIPTION OF THE DRAWINGS

In order to more clearly describe the technical solutions in the embodiments of the present disclosure or the technical solutions in the conventional technology, drawings to be used in the description of the embodiments of the present disclosure or the conventional technology are briefly described hereinafter. It is apparent that the drawings described below merely illustrating some embodiments of the present disclosure, and those skilled in the art may obtain other drawings based on the structures shown in the drawings without any creative effort.

LIST OF REFERENCE NUMERALS

Figure 1:
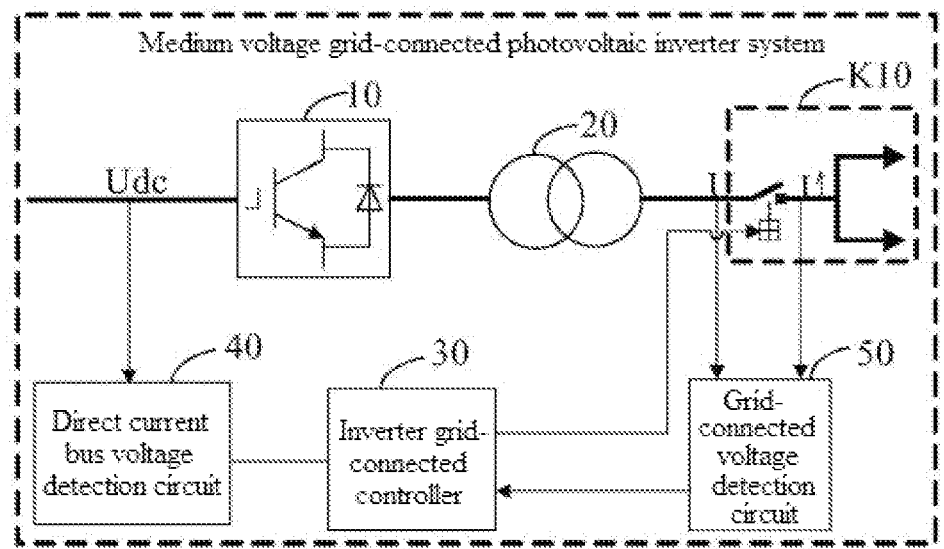
FIG. 1 is a schematic structural diagram illustrating a medium voltage grid-connected photovoltaic inverter system according to an embodiment of the present disclosure.

| Reference numerals | Names |
| --- | --- |
| 10 | Photovoltaic inverter |
| 20 | Medium voltage transformer |
| 30 | Inverter grid-connected controller |
| 40 | Direct current bus voltage detection circuit |
| 50 | Grid-connected voltage detection circuit |
| K10 | Switchgear |

Objects, functional characteristics and advantages of the present disclosure will be further described in conjunction with the embodiments and with reference to the drawings.

DETAILED DESCRIPTION OF EMBODIMENTS

The technical solutions in the embodiments of the present disclosure will be described clearly and completely hereinafter in conjunction with the drawings in the embodiments of the present disclosure. Apparently, the described embodiments are only a part rather than all of the embodiments of the present disclosure. All other embodiments obtained by those skilled in the art based on the embodiments of the present disclosure without any creative work fall in the protection scope of the present disclosure.

It should be noted that, if there is directional indicator (such as up, down, left, right, front, back) in the embodiments of the present disclosure, the directional indicator is only for explaining a relative position, a relative movement or the like between components in a certain posture (as shown in the drawings). The directional indicator varies with the posture.

In addition, if there are descriptions related to "first" and "second" in the embodiments of the present disclosure, the descriptions of "first" and "second" are only for illustration purposes, rather than understood as indicating or implying its relative importance or implicitly indicating the number of the indicated technical features. Therefore, the feature defined with "first" and "second" includes at least one of the features explicitly or implicitly. In addition, technical solutions in the various embodiments may be combined with each other, and the combined technical solution is to be implemented by those skilled in the art. A combination of technical solutions that is contradictory does not exist and is not within the protection scope of the present disclosure.

A medium voltage grid-connected photovoltaic inverter system is provided according to the present disclosure. The medium voltage grid-connected photovoltaic inverter system is applied in a photovoltaic power generation system. The photovoltaic power generation system includes multiple medium voltage photovoltaic grid-connected systems.

Figure 2:
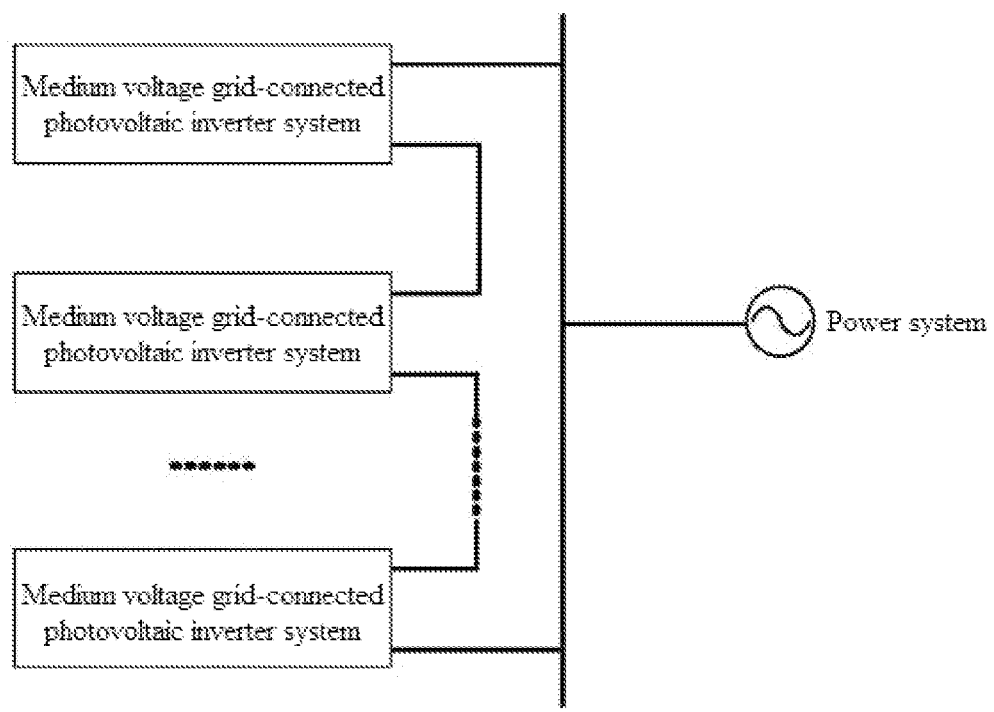
FIG. 2 is a schematic structural diagram illustrating a photovoltaic power generation system according to an embodiment of the present disclosure.

Referring to FIG. 1 and FIG. 2, the medium voltage grid-connected photovoltaic inverter system according to an embodiment of the present disclosure includes a photovoltaic inverter 10, a medium voltage transformer 20, a switchgear K10 and an inverter grid-connected controller 30.

A direct current input terminal of the photovoltaic inverter 10 is connected to a direct current bus.

A low voltage side of the medium voltage transformer 20 is connected to an alternating current output terminal of the photovoltaic inverter 10.

An input terminal of the switchgear K10 is connected to a high voltage side of the medium voltage transformer 20, and an output end of the switchgear K10 is connected to a switchgear K10 of another medium voltage photovoltaic grid-connected system.

The inverter grid-connected controller 30 is connected to a controlled terminal of the switchgear K10. The inverter grid-connected controller 30 is configured to control the switchgear K10 to switch off/on, so that the medium voltage grid-connected photovoltaic inverter system is disconnected from/connected to a grid.

In this embodiment, the inverter converts direct current power generated by a solar cell or direct current power from a battery into alternating current power required by a load. There may be multiple inverters in an inverter system. Respective alternating current sides of the multiple inverters 1 may be connected in parallel directly, or via another device such as a switch. The medium voltage transformer 20 is configured to step-up a low voltage to a medium voltage. A transformation ratio, a voltage level, a power level and a type of the transformer each vary with the inverter system. The transformer may be a double split transformer or a double-winding transformer, which is not specifically limited herein. The switchgear K10 may be one of a ring medium voltage circuit breaker, a medium voltage load switch or a medium voltage contactor. It can be understood that, in this embodiment, the switchgear K10 includes, but is not limited to, the above switches via which the inverter system is connected to/disconnected from the grid. In other embodiments, the switchgear K10 may include another switch, which is not limited herein. Moreover, a switchgear K10 between two photovoltaic power generation systems may be identical to or different from a switchgear K10 between other two photovoltaic power generation systems. In this embodiment, the switchgear K10 is the ring medium voltage circuit breaker for description. Each phase at the output end of the ring medium voltage circuit breaker includes two terminals. In the photovoltaic power generation system includes the medium voltage grid-connected photovoltaic inverter system, output ends of the ring medium voltage circuit breakers respectively in the multiple medium voltage grid-connected photovoltaic inverter systems are directly connected to each other via the bus cable, and a ring medium voltage circuit breaker in a first of the multiple medium voltage grid-connected photovoltaic inverter systems and a ring medium voltage circuit breaker in a last of the multiple medium voltage grid-connected photovoltaic inverter systems each are connected to a medium voltage power system, to form a ring network.

The inverter grid-connected controller 30 in configured to, in response to various detection signals of the photovoltaic power generation system, control the switchgear K10 to switch on in order to connect the photovoltaic power generation system to the grid, or control the switchgear K10 to switch off in order to disconnect the photovoltaic power generation system from the grid.

According to the present disclosure, the alternating current output side of the photovoltaic inverter 10 is connected to the low voltage side of the medium voltage transformer 20, the high voltage side of the medium voltage transformer 20 is connected to one switchgear K10, and the output end of the switchgear K10 is connected to the medium voltage power grid, thereby forming a medium voltage grid-connected photovoltaic inverter system based on the switchgear K10. Therefore, the medium voltage grid-connected photovoltaic inverter system can be directly connected to the grid to form a ring network, and the number of the ring main unit is reduced compared with the solution in which the medium voltage grid-connected photovoltaic inverter system is connected to the grid via a ring main unit in order to from a ring network.

Referring to FIG. 1 and FIG. 2, in an embodiment, the medium voltage grid-connected photovoltaic inverter system further includes a direct current bus voltage detection circuit 40.

A detection terminal of the direct current bus voltage detection circuit 40 is connected to the direct current bus, and an output terminal of the direct current bus voltage detection circuit 40 is connected to the inverter grid-connected controller 30. The direct current bus voltage detection circuit 40 is configured to detect a voltage of the direct current bus, and generate a direct current bus voltage detection signal.

The inverter grid-connected controller 30 is further configured to control the switchgear K10 to switch off when determining based on the direct current bus voltage detection signal that the voltage of the direct current bus is less than a first preset voltage threshold.

In this embodiment, the direct current bus voltage detection circuit 40 may be implemented by a direct current voltage transformer. The direct current bus voltage detection circuit 40 detects a direct current bus voltage $U_{dc}$ at the input terminal of the photovoltaic inverter 10, and sends the generated direct current bus voltage detection signal to the inverter grid-connected controller 30. The first preset voltage threshold is a minimum grid-connected voltage. When the direct current bus voltage Udc is less than the minimum grid-connected voltage, the photovoltaic inverter 10 switches to a sleep mode. The inverter grid-connected controller 30 sends an opening command to the ring medium voltage circuit breaker, the ring medium voltage circuit breaker is switched off, and the medium voltage grid-connected inverter system based on the switchgear K10 is disconnected from the grid.

In an embodiment, the inverter grid-connected controller 30 is further configured to control the switchgear K10 to switch off when determining based on the direct current bus voltage detection signal that the direct current bus voltage is less than the first preset voltage threshold for a first preset period of time.

It can be understood that, a voltage fluctuation may occur in the process that a photovoltaic cell assembly or a storage battery supplies electrical energy to the direct current bus, so that the direct current bus voltage detection circuit 40 detects that the direct current bus voltage Udc is less than the minimum grid-connected voltage for only a short period of time. In this case, the inverter grid-connected controller 30 sending an opening command to the ring medium voltage circuit breaker may result in malfunction. Therefore, in this embodiment, after the photovoltaic inverter 10 switches to the sleep mode and when the direct current bus voltage Udc is less than the minimum grid-connected voltage for a period of time (that is, the first preset period of time), the inverter grid-connected controller 30 sends the opening command to the ring medium voltage circuit breaker, the ring medium voltage circuit breaker is switched off, and the medium voltage grid-connected inverter system based on the switchgear K10 is disconnected from the grid.

Referring to FIG. 1 and FIG. 2, in an embodiment, the medium voltage grid-connected photovoltaic inverter system further includes a grid-connected voltage detection circuit 50.

A first detection terminal of the grid-connected voltage detection circuit 50 is connected to the high voltage side of the medium voltage transformer 20, and a second detection terminal of the grid-connected voltage detection circuit 50 is connected to a side of the medium voltage power grid. The grid-connected voltage detection circuit 50 is configured to detect a line voltage at the high voltage side of the medium voltage transformer 20 and a line voltage at the side of the medium voltage power grid, and generate a grid-connected voltage detection signal.

The inverter grid-connected controller 30 is further configured to control the switchgear K10 to switch on when determining based on the grid-connected voltage detection signal that a line voltage currently detected at the high voltage side of the medium voltage transformer 20 and a line voltage currently detected at the side of the medium voltage power grid satisfy a grid-connected condition.

In this embodiment, in a case that the medium voltage grid-connected photovoltaic inverter system based on the switchgear K10 is off-grid and after the photovoltaic inverter 10 is started, the grid-connected voltage detection circuit detects a line voltage U at the high voltage side of the medium voltage transformer 20 and a line voltage U' at the side of the medium voltage power grid, and then sends a grid-connected voltage detection signal to the inverter grid-connected controller 30. The inverter grid-connected controller 30 sends, when determining that a grid-connected condition is satisfied, a closing command to the ring medium voltage circuit breaker, so that the ring medium voltage circuit breaker is switched on, and the inverter is connected to the grid. The grid-connected condition is that the line voltage at the high voltage side of the medium voltage transformer 20 and the line voltage at the side of the medium voltage power grid have the same phase, phase sequence and amplitude.

Referring to FIG. 1 and FIG. 2, in an embodiment, the medium voltage grid-connected photovoltaic inverter system further includes an ambient light sensor (not shown in the drawings). An output terminal of the ambient light sensor is connected to the inverter grid-connected controller 30. The ambient light sensor is configured to detect ambient light, and output an ambient light detection signal.

The inverter grid-connected controller 30 is further configured to control the switchgear K10 to switch off when determining based on the ambient light detection signal that the current detected ambient light is less than a preset threshold.

In this embodiment, the ambient light sensor is configured to detect luminous intensity of the ambient light. The ambient light sensor may be implemented by a photosensitive element. The ambient light sensor outputs a level signal depending on a comparison result between the detected luminous intensity and a set intensity threshold, for example, a low level signal in a cased that the detected luminous intensity is less than the intensity threshold, and a high level signal in a case that the detected luminous intensity is greater than or equal to the intensity threshold. Therefore, the inverter grid-connected controller 30 receives a level signal corresponding to the detected luminous intensity, and determines based on the level signal whether the currently detected ambient light shows a sunny day with strong light or a night or a cloudy and rainy day with weak light. When the currently detected ambient light is weak, the photovoltaic inverter 10 switches to the sleep mode, the inverter grid-connected controller 30 sends an opening command to the ring medium voltage circuit breaker, the ring medium voltage circuit breaker is switched off, and the medium voltage grid-connected inverter system based on the switchgear K10 is disconnected from the grid. Therefore, when the photovoltaic system does not generate electricity at night or on a cloudy day, the inverter is in the sleep mode, and the medium voltage circuit breaker is switched off, so that the medium voltage transformer 20 is disconnected from the power grid, thereby eliminating no-load loss of the transformer.

Referring to FIG. 1 and FIG. 2, in an embodiment, the inverter grid-connected controller 30 is further configured to control the switchgear K10 to switch on in response to reception of a reactive power transmission signal.

In this embodiment, the inverter grid-connected controller 30 may also receive a reactive power transmission signal. The controller may receive a nighttime reactive power transmission signal (SVG work instruction) issued by an upper-level power grid dispatching center. When the photovoltaic inverter 10 is to send reactive power to the power grid at night, the inverter grid-connected controller 30 sends a closing command to the ring medium voltage circuit breaker based on the reactive power transmission signal, so that the ring medium voltage circuit breaker is switched on, and the inverter is connected to the grid, thereby realizing medium voltage grid connection and outputting reactive power. In order to stop the nighttime SVG function, the inverter grid-connected controller 30 sends an opening command to the ring medium voltage circuit breaker, the ring medium voltage circuit breaker is switched off, and the medium voltage grid-connected inverter system based on the switchgear K10 is disconnected from the grid. In this way, the medium voltage transformer 20 is connected to the grid while sending reactive power to the power grid, thereby avoiding no-load loss of the medium voltage transformer 20 in the ring network, and reducing power loss of the system compared with the conventional solution.

A photovoltaic power generation system is further provided according to the present disclosure. The photovoltaic power generation system includes a medium voltage power system and multiple above-mentioned medium voltage grid-connected photovoltaic inverter systems. The detailed structure of the medium voltage grid-connected photovoltaic inverter system may refer to the above-mentioned embodiments, and thus is not repeated here. It can be understood that, since the photovoltaic power generation system according to the present disclosure includes the above medium voltage grid-connected photovoltaic inverter system, the embodiments of the photovoltaic power generation system according to the present disclosure include all technical solutions in all embodiments of the medium voltage grid-connected photovoltaic inverter system, and have the same technical effects as the embodiments of the medium voltage grid-connected photovoltaic inverter system, which are not repeated here.

Referring to FIG. 1 and FIG. 2, in an embodiment, the multiple medium voltage grid-connected photovoltaic inverter systems are connected to each other by connecting output ends of their respective ring medium voltage circuit breakers.

In this embodiment, in the photovoltaic power generation system includes the medium voltage grid-connected photovoltaic inverter system, output ends of switchgears respectively in the multiple medium voltage grid-connected photovoltaic inverter systems are directly connected to each other via the bus cable, and a switchgear in a first of the multiple medium voltage grid-connected photovoltaic inverter systems and a switchgear in a last of the multiple medium voltage grid-connected photovoltaic inverter systems each are connected to the medium voltage power system, to form a ring network.

In order to form a ring network, that is, be connected to the grid, all medium voltage grid-connected photovoltaic inverter systems except a first medium voltage grid-connected photovoltaic inverter system and a last medium voltage grid-connected photovoltaic inverter system are connected to each other via the output ends of their respective ring medium voltage circuit breakers and the bus cable, and The switchgear in the first medium voltage grid-connected photovoltaic inverter system and the switchgear in the last medium voltage grid-connected photovoltaic inverter system each are connected to the medium voltage power system, thereby forming the ring network finally.

In case of an open circuit, that is, when the inverter system is disconnected from the grid, the two output terminals in the inverter system are still connected to an adjacent medium voltage grid-connected photovoltaic inverter system. That is, a single off-grid medium voltage grid-connected photovoltaic inverter system does not affect the ring network formed by other medium voltage grid-connected photovoltaic inverter systems.

The above descriptions are only optional embodiments of the present disclosure, and are not intended to limit the patent scope of the present disclosure. Any equivalent structural transformation made based on the specification and drawings of the present disclosure or direct/indirect application in other related technical fields without departing from the concept of the present disclosure is included in the protection scope of the present disclosure.

The invention claimed is:

1. A medium voltage grid-connected photovoltaic inverter system, applied in a photovoltaic power generation system, wherein the number of the medium voltage grid-connected photovoltaic inverter system in the photovoltaic power generation system is more than one, and the medium voltage grid-connected photovoltaic inverter system comprises:
   a photovoltaic inverter, wherein a direct current input terminal of the photovoltaic inverter is connected to a direct current bus;
   a medium voltage transformer, wherein a low voltage side of the medium voltage transformer is connected to an alternating current output terminal of the photovoltaic inverter;
   a switchgear, wherein an input terminal of the switchgear is connected to a high voltage side of the medium voltage transformer, and each phase of the switchgear comprises two output terminals each configured to be connected to a switchgear of another medium voltage grid-connected photovoltaic inverter system; and output terminals of switchgears in the more than one medium voltage grid-connected photovoltaic inverter systems are directly connected to each other via a bus cable, and a switchgear in a first of the more than one medium voltage grid-connected photovoltaic inverter systems and a switchgear in a last of the more than one medium voltage grid-connected photovoltaic inverter systems each are connected to a medium voltage power system of the photovoltaic power generation system, so as to form a ring network; wherein the switchgear is a ring medium voltage circuit breaker, a medium voltage load switch or a medium voltage contactor; and
   an inverter grid-connected controller connected to a controlled terminal of the switchgear, wherein the inverter grid-connected controller is configured to control the switchgear to switch off to disconnect the medium voltage grid-connected photovoltaic inverter system from a grid, or control the switchgear to switch on to connect the medium voltage grid-connected photovoltaic inverter system to the grid.

2. The medium voltage grid-connected photovoltaic inverter system according to claim 1, further comprising:
   a direct current bus voltage detection circuit, wherein a detection terminal of the direct current bus voltage detection circuit is connected to the direct current bus, an output terminal of the direct current bus voltage detection circuit is connected to the inverter grid-connected controller, and the direct current bus voltage detection circuit is configured to detect a voltage of the direct current bus, and generate a direct current bus voltage detection signal,
   wherein the inverter grid-connected controller is further configured to control the switchgear to switch off when it is determined based on the direct current bus voltage detection signal that the voltage of the direct current bus is less than a first preset voltage threshold.

3. The medium voltage grid-connected photovoltaic inverter system according to claim 2, wherein the inverter grid-connected controller is further configured to control the switchgear to switch off when it is determined based on the direct current bus voltage detection signal that the voltage of the direct current bus is less than the first preset voltage threshold for a first preset period of time.

4. The medium voltage grid-connected photovoltaic inverter system according to claim 1, further comprising:
   a grid-connected voltage detection circuit, wherein a first detection terminal of the grid-connected voltage detection circuit is connected to the high voltage side of the medium voltage transformer, a second detection terminal of the grid-connected voltage detection circuit is connected to a side of a medium voltage power grid, and the grid-connected voltage detection circuit is configured to detect a line voltage at the high voltage side of the medium voltage transformer and a line voltage at the side of the medium voltage power grid, and generate a grid-connected voltage detection signal, wherein the inverter grid-connected controller is further configured to control the switchgear to switch on when it is determined based on the grid-connected voltage detection signal that the line voltage currently detected at the high voltage side of the medium voltage transformer and the line voltage currently detected at the side of the medium voltage power grid satisfy a grid-connected condition.

5. The medium voltage grid-connected photovoltaic inverter system according to claim 4, wherein the grid-connected condition is that the line voltage at the high voltage side of the medium voltage transformer and the line voltage at the side of the medium voltage power grid have same phase, same phase sequence and same amplitude.

6. The medium voltage grid-connected photovoltaic inverter system according to claim 1, further comprising:
an ambient light sensor, wherein an output terminal of the ambient light sensor is connected to the inverter grid-connected controller, and the ambient light sensor is configured to detect ambient light, and output an ambient light detection signal,
wherein the inverter grid-connected controller is further configured to control the switchgear to switch off when it is determined based on the ambient light detection signal that the ambient light currently detected is less than a preset threshold.

7. The medium voltage grid-connected photovoltaic inverter system according to claim 1, wherein the inverter grid-connected controller is further configured to control, in response to reception of a reactive power transmission signal, the switchgear to switch on.

8. A photovoltaic power generation system, comprising:
a medium voltage power system; and
a plurality of medium voltage grid-connected photovoltaic inverter systems, wherein each of the plurality of medium voltage grid-connected photovoltaic inverter systems comprise:
a photovoltaic inverter, wherein a direct current input terminal of the photovoltaic inverter is connected to a direct current bus;
a medium voltage transformer, wherein a low voltage side of the medium voltage transformer is connected to an alternating current output terminal of the photovoltaic inverter;
a switchgear, wherein an input terminal of the switchgear is connected to a high voltage side of the medium voltage transformer, and each phase of the switchgear comprises two output terminals each configured to be connected to a switchgear of another medium voltage grid-connected photovoltaic inverter system; and output terminals of switchgears in the plurality of medium voltage grid-connected photovoltaic inverter systems are directly connected to each other via a bus cable, and a switchgear in a first of the plurality of medium voltage grid-connected photovoltaic inverter systems and a switchgear in a last of the plurality of medium voltage grid-connected photovoltaic inverter systems each are connected to the medium voltage power system, so as to form a ring network; wherein the switchgear is a ring medium voltage circuit breaker, a medium voltage load switch or a medium voltage contactor; and
an inverter grid-connected controller connected to a controlled terminal of the switchgear, wherein the inverter grid-connected controller is configured to control the switchgear to switch off to disconnect the medium voltage grid-connected photovoltaic inverter system from a grid, or control the switchgear to switch on to connect the medium voltage grid-connected photovoltaic inverter system to the grid.

* * * * *